(12) United States Patent
Kim et al.

(10) Patent No.: US 9,123,688 B2
(45) Date of Patent: Sep. 1, 2015

(54) SEMICONDUCTOR MODULE PACKAGE

(71) Applicant: SAMSUNG ELECTRO-MECHANICS CO., LTD., Suwon (KR)

(72) Inventors: Tae Hyun Kim, Suwon (KR); Bum Seok Suh, Suwon (KR); Joon Hyung Cho, Suwon (KR); Si Joong Yang, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 14/043,549

(22) Filed: Oct. 1, 2013

(65) Prior Publication Data

US 2014/0183717 A1 Jul. 3, 2014

(30) Foreign Application Priority Data

Dec. 31, 2012 (KR) .................. 10-2012-0158667

(51) Int. Cl.
*H01L 23/48* (2006.01)
*H01L 23/373* (2006.01)
*H01L 23/40* (2006.01)

(52) U.S. Cl.
CPC ......... *H01L 23/3735* (2013.01); *H01L 23/3736* (2013.01); *H01L 2023/4056* (2013.01); *H01L 2224/48095* (2013.01); *H01L 2224/48137* (2013.01); *H01L 2224/48139* (2013.01); *H01L 2224/49175* (2013.01); *H01L 2924/1305* (2013.01); *H01L 2924/13034* (2013.01); *H01L 2924/13055* (2013.01); *H01L 2924/13091* (2013.01)

(58) Field of Classification Search
CPC .............. H01L 23/34; H01L 2224/48137; H01L 2224/48095; H01L 2224/49175; H01L 2924/00014
See application file for complete search history.

(56) References Cited

U.S. PATENT DOCUMENTS

| | | | |
|---|---|---|---|
| 2006/0120047 A1* | 6/2006 | Inoue | 361/699 |
| 2011/0233608 A1 | 9/2011 | Cottet | |
| 2012/0235162 A1* | 9/2012 | Isobe et al. | 257/77 |
| 2014/0160821 A1* | 6/2014 | Tokuyama et al. | 363/132 |
| 2014/0167901 A1* | 6/2014 | Persson et al. | 336/200 |

FOREIGN PATENT DOCUMENTS

| | | |
|---|---|---|
| JP | 08-195471 | 7/1996 |
| KR | 1994-0008343 | 9/1994 |

OTHER PUBLICATIONS

Office action dated Nov. 22, 2013 from Korean Patent Application No. 10-2012-0158667 and its English summary provided by the client.

* cited by examiner

*Primary Examiner* — A. Sefer
(74) *Attorney, Agent, or Firm* — Ladas & Parry, LLP

(57) ABSTRACT

Disclosed herein is a semiconductor module package, including: a first module including a first heat radiation substrate and one or more first semiconductor elements and having a first N terminal and a first P terminal formed at one end thereof; a second module including a second heat radiation substrate and one or more second semiconductor elements, having a second N terminal and a second P terminal formed at one end thereof, and disposed so as to face the first module; and a first output terminal formed by electrically connecting the first module to the second module.

7 Claims, 3 Drawing Sheets

SEMICONDUCTOR MODULE PACKAGE

CROSS REFERENCE TO RELATED APPLICATION

This application claims the benefit of Korean Patent Application No. 10-2012-0158667, filed on Dec. 31, 2012, entitled "Semiconductor Module Package", which is hereby incorporated by reference in its entirety into this application.

BACKGROUND OF THE INVENTION

1. Technical Field

The present invention relates to a semiconductor module package.

2. Description of the Related Art

A semiconductor module package is one that a plurality of semiconductor elements are packaged into one package. Here, the semiconductor element may be a silicon controlled rectifier (SCR), a power transistor, an insulated gate bipolar transistor (IGBT), a metal oxide semiconductor (MOS) transistor, a power rectifier, a power regulator, an inverter, a converter, or like. This semiconductor module package may have one or more semiconductor elements mounted on one package (US Patent Laid-Open Publication No. 20110233608). In some cases, different types of semiconductor elements may be mounted on one package. The above-mentioned semiconductor package conventionally requires one input terminal, one N terminal, and one output terminal in order to form one phase output terminal. However, since the above-mentioned semiconductor package according to the prior art simultaneously mounts a plurality of semiconductor elements on one DBC substrate, the semiconductor package itself should be replaced once a defect occurs at one element. In addition, since the semiconductor package requires a total of three patterns for one phase module substrate, this causes a size of the module to be increased.

SUMMARY OF THE INVENTION

The present invention has been made in effort to provide a semiconductor module package capable of decreasing processing time and cost.

The present invention has been made in effort to provide a semiconductor module package capable of decreasing a size thereof.

The present invention has been made in effort to provide a semiconductor module package capable of decreasing cost caused by a defect occurrence.

According to a preferred embodiment of the present invention, there is provided a semiconductor module package, including: a first module including a first heat radiation substrate and one or more first semiconductor elements and having a first N terminal and a first P terminal formed at one end thereof; a second module including a second heat radiation substrate and one or more second semiconductor elements, having a second N terminal and a second P terminal formed at one end thereof, and disposed so as to face the first module; and a first output terminal formed by electrically connecting the first module to the second module.

The first output terminal may be formed by electrically connecting the first P terminal to the second N terminal.

The first output terminal may output at least one of W, V, and U phases.

According to another preferred embodiment of the present invention, there is provided a semiconductor module package, including: a first module including a first heat radiation substrate and one or more first semiconductor elements and having a first N terminal and a first P terminal formed at one end thereof; a second module including a second heat radiation substrate and one or more second semiconductor elements, having a second N terminal and a second P terminal formed at one end thereof, and disposed so as to face the first module; a third module including a third heat radiation substrate and one or more third semiconductor elements and having a third N terminal and a third P terminal formed at one end thereof; a fourth module including a fourth heat radiation substrate and one or more fourth semiconductor elements, having a fourth N terminal and a fourth P terminal formed at one end thereof, and disposed so as to face the third module; a fifth module including a fifth heat radiation substrate and one or more fifth semiconductor elements and having a fifth N terminal and a fifth P terminal formed at one end thereof; a sixth module including a sixth heat radiation substrate and one or more sixth semiconductor elements, having a sixth N terminal and a sixth P terminal formed at one end thereof, and disposed so as to face the fifth module; a first output terminal formed by electrically connecting the first module to the second module; a second output terminal formed by electrically connecting the third module to the fourth module; and a third output terminal formed by electrically connecting the fifth module to the sixth module.

The first output terminal may be formed by electrically connecting the first P terminal to the second N terminal, the second output terminal may be formed by electrically connecting the third P terminal to the fourth N terminal, and the third output terminal may be formed by electrically connecting the fifth P terminal to the sixth N terminal.

The first output terminal may output a W phase of W, V, and U phases, the second output terminal may output a V phase of W, V, and U phases, and the third output terminal may output a U phase of W, V, and U phases.

The semiconductor module package may further include a heat radiation plate formed at a lower portion of the first module to the sixth module.

The semiconductor module package may further include a housing formed so as to surround the first module to the sixth module.

The first N terminal, the second P terminal, the third N terminal, the fourth P terminal, the fifth N terminal, the sixth P terminal, the first output terminal, the second output terminal, and the third output terminal may be formed so as to be protruded to the outside while penetrating through the housing.

The semiconductor module package may further include a housing terminal having one end contacting at least one of the first N terminal, the second P terminal, the third N terminal, the fourth P terminal, the fifth N terminal, the sixth P terminal, the first output terminal, the second output terminal, and the third output terminal, and the other end formed so as to be protruded to the outside while penetrating through the housing.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
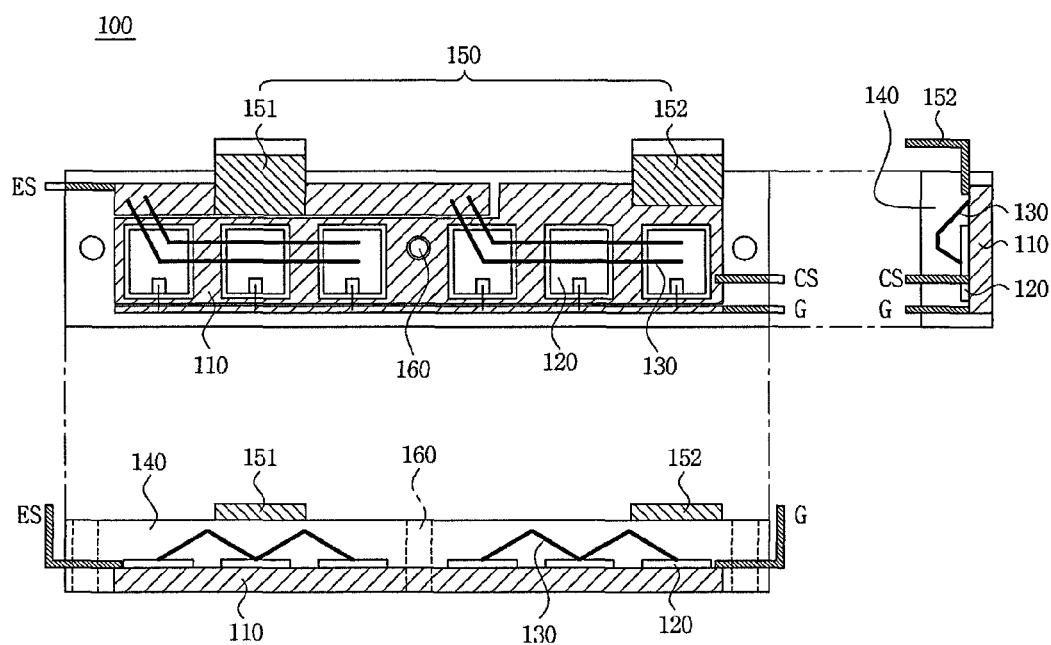
FIG. 1 is an exemplary view of a first module according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is an exemplary view of a first module according to a preferred embodiment of the present invention.

Referring to FIG. 1, the first module 100 may include a first heat radiation substrate 110, a first semiconductor element 120, a first connection member 130, a first molding part 140, and the first terminal 150.

The first heat radiation substrate 110 may radiate heat generated from the first semiconductor element 120 to the outside. The first heat radiation substrate 110 may be made of a heat conductive material. For example, the first heat radiation substrate 110 may be formed to include copper or aluminum. Alternatively, the first heat radiation substrate 110 may be a direct bonding copper (DBC) substrate.

The first semiconductor element 120 may be formed on the first heat radiation substrate 110. One or more first semiconductor elements 120 may be formed. According to the preferred embodiment of the present invention, the first module 100 may include six first semiconductor elements 120. As the first semiconductor element 120, a silicon controlled rectifier (SCR), a power transistor, an insulated gate bipolar transistor (IGBT), a metal oxide semiconductor (MOS) transistor, a power rectifier, a power regulator, an inverter, a converter, or a high power semiconductor chip or diode formed of a combination thereof may be used.

Although not shown in the preferred embodiment of the present invention, an insulating layer (not shown) may be formed between the first heat radiation substrate 110 and the first semiconductor element 120.

The first connection member 130 may be formed so as to electrically connect between the first semiconductor elements 120. Alternatively, although not shown, the first connection member 130 may electrically connect the first semiconductor elements 120 to a circuit pattern (not shown) formed on the first heat radiation substrate 110. The first connection member 130 may be formed of an electrical conductive material such as copper. For example, the first connection member 130 may be a wire or a lead frame.

The first molding part 140 may be formed so as to protect the first semiconductor element 120 and the first connection member 130 from an external environment. The first molding part 140 may be formed so as to surround the first semiconductor element 120 and the first connection member 130. For example, the first molding part 140 may be formed of an epoxy molding compound (EMC).

The first terminal 150 may connect between an inside and the outside of the first module 100. The first terminal 150 may be formed of a first N terminal 151 and a first P terminal 152.

The first N terminal 151 may be a terminal applying external power to the first module 100. The first N terminal 151 may apply external power to the first semiconductor element 120. The first P terminal 152 may be a terminal capable of applying output voltage of the first module 100 to the outside.

The first terminal 150 formed as described above has one end electrically connected to the first semiconductor element 120 or the circuit pattern (not shown) of the first heat radiation substrate 100, and the other end protruded to the outside of the first molding part 140.

Figure 3:
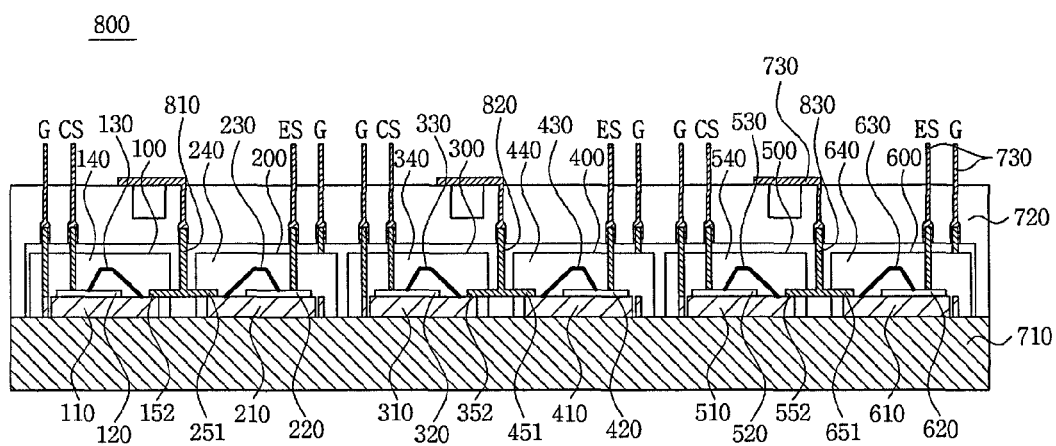
FIG. 3 is an exemplary view showing a side view of the semiconductor module package according to the preferred embodiment of the present invention.

In addition, according to the preferred embodiment of the present invention, the first module 100 may be provided with a connecting hole 160 for connecting with a heat radiation plate (710 of FIG. 3). However, the connecting hole 160 is to screw-connect with the heat radiation plate (710 of FIG. 3) and the connecting hole 160 is a configuration part which may be removed when the heat radiation plate (710 of FIG. 3) and the first module 100 are adhered by an adhesive member. As the adhesive member, an adhesive material of a heat conductive material may be used. Alternatively, low temperature firing materials such as solder, a silver (Ag) paste, a copper paste, and the like may be used.

Although not described in the preferred embodiment of the present invention, it is generally obvious to those skilled in the art that a sensor terminal and a gate terminal applied to the module including the semiconductor element may be further formed. Therefore, a description thereof will be omitted.

Although the preferred embodiment of the present invention illustrates only the first module, the above-mentioned configuration may also be applied to a second module (200 of FIG. 3) to a sixth module (600 of FIG. 3). That is, the second module (200 of FIG. 3) to the sixth module (600 of FIG. 3) configuring the semiconductor module package according to the preferred embodiment of the present invention may be formed of the same structure as the first module 100.

Figure 2:
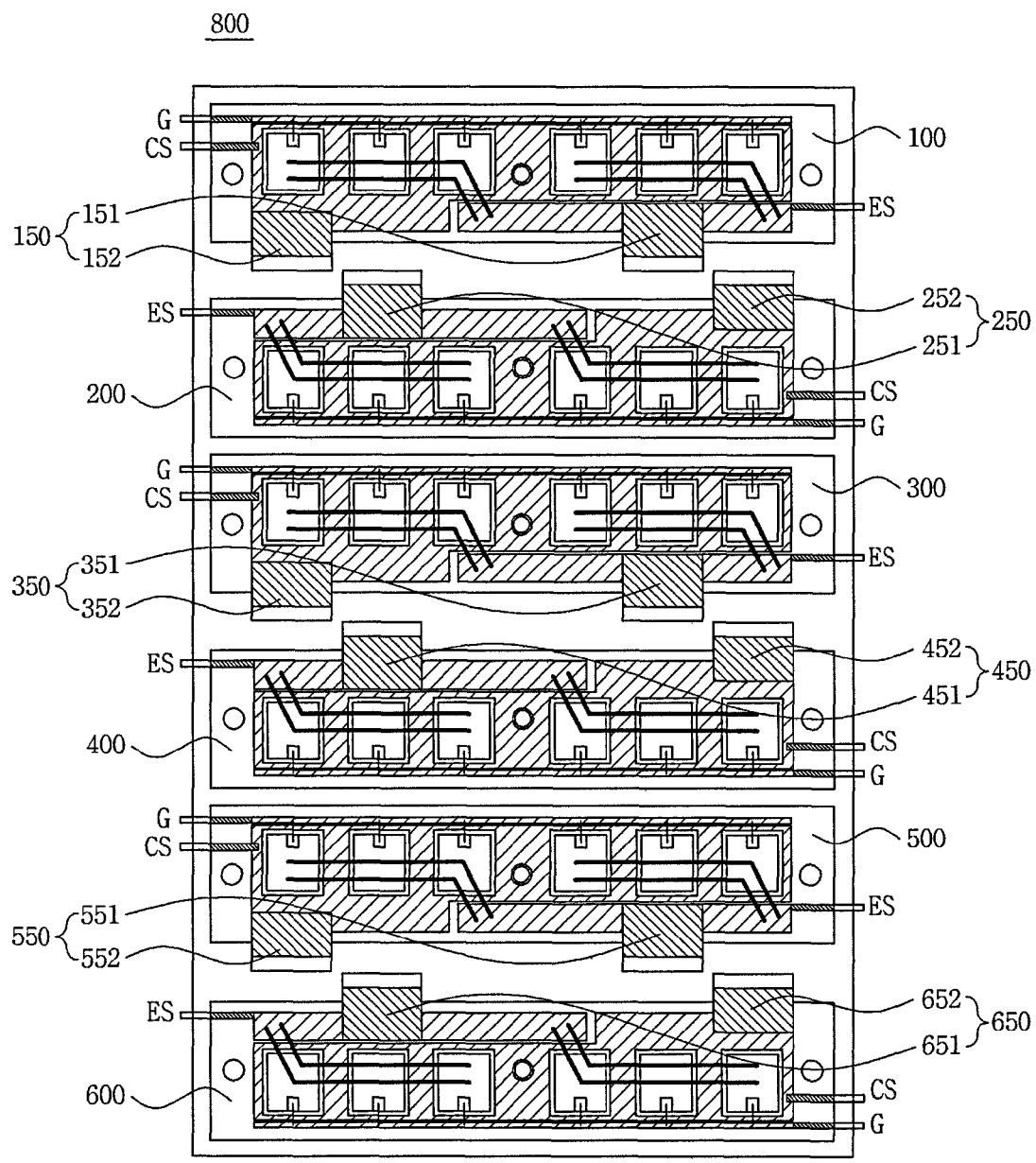
FIG. 2 is an exemplary view of a semiconductor module package according to the preferred embodiment of the present invention.

FIG. 2 is an exemplary view of a semiconductor module package according to the preferred embodiment of the present invention.

Referring to FIG. 2, an arrangement of the first module 100 to the sixth module 600 configuring a semiconductor module package 800 may be seen.

The semiconductor module package 800 may include the first module 100 to the sixth module 600. In this configuration, a first output terminal (810 of FIG. 3) may be formed from the first module 100 and a second module 200. In addition, a second output terminal (820 of FIG. 3) may be formed from a third module 300 and a fourth module 400. In addition, a third output terminal (830 of FIG. 3) may be formed from a fifth module 500 and a sixth module 600.

The first module 100 and the second module 20 may be disposed so as to face each other. That is, the second module 200 may be disposed in a form in which the first module 100 is rotated by 180°. By the arrangement as described above, a first P terminal 152 of the first module 100 and a second N terminal 251 of the second module 200 may be disposed adjacent to each other. Although not shown in the present invention, the first P terminal 152 and the second N terminal 251 adjacent to each other may be electrically connected to each other. Therefore, a signal input from a second P terminal 252 may be input to the first P terminal 152 through the second N terminal 251. That is, when the signal is input to the second module 200, the signal may be transmitted to the first module 100 through the second module 200. The first output terminal (810 of FIG. 3) may be formed at the first P terminal 152 and the second N terminal 251 as described above. In this configuration, the first output terminal (810 of FIG. 3) may be an output terminal outputting a W phase among three phases (W, V, U). According to the preferred embodiment of the present invention, the second module 200 is disposed so as to face the first module 100, such that the W phase may be output using one input and one output.

The third module 300 and the fourth module 400 may be disposed so as to face each other. That is, the fourth module 400 may be disposed in a form in which the third module 300 is rotated by 180°. By the arrangement as described above, a third P terminal 352 of the third module 300 and a fourth N terminal 451 of the fourth module 400 may be disposed adjacent to each other. Although not shown in the present invention, the third P terminal 352 and the fourth N terminal 451 adjacent to each other may be electrically connected to each other. Therefore, a signal input from a fourth P terminal 452 may be input to the third P terminal 352 through the fourth N terminal 451. That is, when the signal is input to the fourth module 400, the signal may be transmitted to the third module 300 through the fourth module 400. The second output terminal (820 of FIG. 3) may be formed at the third P terminal 352 and the fourth N terminal 451 as described above. In this configuration, the second output terminal (820 of FIG. 3) may be an output terminal outputting a V phase among three phases (W, V, U). According to the preferred embodiment of the present invention, the fourth module 400 is disposed so as to face the third module 300, such that the V phase may be output using one input and one output.

The fifth module 500 and the sixth module 600 may be disposed so as to face each other. That is, the sixth module 600 may be disposed in a form in which the fifth module 500 is rotated by 180°. By the arrangement as described above, a fifth P terminal 552 of the fifth module 500 and a sixth N terminal 651 of the sixth module 600 may be disposed adjacent to each other. Although not shown in the present invention, the third P terminal 552 and the fourth N terminal 651 adjacent to each other may be electrically connected to each other. Therefore, a signal input from a sixth P terminal 652 may be input to the fifth P terminal 552 through the sixth N terminal 651. That is, when the signal is input to the sixth module 600, the signal may be transmitted to the fifth module 500 through the sixth module 600. The third output terminal (830 of FIG. 3) may be formed at the fifth P terminal 552 and the sixth N terminal 651 as described above. In this configuration, the third output terminal (830 of FIG. 3) may be an output terminal outputting a U phase among three phases (W, V, U). According to the preferred embodiment of the present invention, the sixth module 600 is disposed so as to face the fifth module 500, such that the U phase may be output using one input and one output.

FIG. 3 is an exemplary view showing a side view of the semiconductor module package according to the preferred embodiment of the present invention.

Referring to FIG. 3, the semiconductor module package 800 may include the first module 100 to the sixth module 600, a heat radiation plate 710, a housing 720, and a housing terminal 730.

In the preferred embodiment of the present invention, since both of the first module 100 and the sixth module 600 are configured of the same configuration parts as those described in FIG. 1, the respective modules are briefly described and a detail description thereof is referred to FIG. 1.

The first module 100 may include the first heat radiation substrate 110, the first semiconductor element 120, the first connection member 130, the first molding part 140, and the first terminal (150 of FIG. 2).

The first heat radiation substrate 110 may radiate heat generated from the first semiconductor element 120 to the outside. The first heat radiation substrate 110 may be made of a heat conductive material. The first semiconductor element 120 may be formed on the first heat radiation substrate 110. One or more first semiconductor elements 120 may be formed. The first connection member 130 may be formed so as to electrically connect between the first semiconductor element 120 and a circuit pattern (not shown). The first connection member 130 may be formed of a wire or a lead frame. The first molding part 140 may be formed so as to protect the first semiconductor element 120 and the first connection member 130. The first molding part 140 may be formed of an epoxy molding compound. The first terminal (150 of FIG. 2) may be a terminal connecting between an inside and the outside of the first module 100. The first terminal (150 of FIG. 2) may include the first N terminal (151 of FIG. 2) and the first P terminal 152.

The second module 200 may include a second heat radiation substrate 210, a second semiconductor element 220, a second connection member 230, a second molding part 240, and a second terminal (250 of FIG. 2). The second terminal (250 of FIG. 2) may be a terminal connecting between an inside and the outside of the second module 200. The second terminal (250 of FIG. 2) may include the second N terminal 251 and the second P terminal 252.

In this configuration, the first module 100 and the second module 20 may be disposed so as to face each other. Therefore, the first P terminal 152 of the first module 100 and the second N terminal 251 of the second module 200 may be disposed so as to face each other. In addition, the first P terminal 152 and the second N terminal 251 may be electrically connected to each other without an additional circuit pattern. In this case, the first P terminal 152 and the second N terminal 251 may directly contact the outside of the first module 110 and the second module 200, or may be electrically connected to each other by being connected by the electrical conductive material. As described above, the first P terminal 152 and the second N terminal 251 may be electrically connected to each other so as to form the first output terminal 810. Here, the first output terminal 810 may output the W phase.

The third module 300 may include a third heat radiation substrate 310, a third semiconductor element 320, a third connection member 33Q, a third molding part 340, and a third terminal (350 of FIG. 2). The third terminal (350 of FIG. 2) may be a terminal connecting between an inside and the outside of the third module 300. The third terminal (350 of FIG. 2) may include a third N terminal (351 of FIG. 2) and a third P terminal 352.

The fourth module 400 may include a fourth heat radiation substrate 410, a fourth semiconductor element 420, a fourth connection member 430, a fourth molding part 440, and a fourth terminal (450 of FIG. 2). The fourth terminal (450 of FIG. 2) may be a terminal connecting between an inside and the outside of the fourth module 400. The fourth terminal (450 of FIG. 2) may include a fourth N terminal 451 and a first P terminal (452 of FIG. 2).

In this configuration, the third module 300 and the fourth module 400 may be disposed so as to face each other. Therefore, the third P terminal 352 of the third module 300 and the fourth N terminal 451 of the fourth module 400 may be disposed so as to face each other. In addition, the third P terminal 352 and the fourth N terminal 451 may be electrically connected to each other without an additional circuit pattern. In this case, the third P terminal 352 and the fourth N terminal 451 may directly contact the outside of the third module 300 and the fourth module 400, or may be electrically connected to each other by being connected by the electrical conductive material. As described above, the third P terminal 352 and the fourth N terminal 451 may be electrically connected to each other so as to form the second output terminal 820. Here, the second output terminal 820 may output the V phase.

The fifth module 500 may include a fifth heat radiation substrate 510, a fifth semiconductor element 520, a fifth connection member 530, a fifth molding part 540, and a fifth terminal (550 of FIG. 2). The fifth terminal (550 of FIG. 2) may be a terminal connecting between an inside and the outside of the fifth module 500. The fifth terminal (550 of FIG. 2) may include a fifth N terminal (551 of FIG. 2) and a fifth P terminal 552.

The sixth module 600 may include a sixth heat radiation substrate 610, a sixth semiconductor element 620, a sixth connection member 630, a sixth molding part 640, and a sixth terminal (650 of FIG. 2). The sixth terminal (650 of FIG. 2) may be a terminal connecting between an inside and the outside of the sixth module 600. The sixth terminal (650 of FIG. 2) may include a sixth N terminal 651 and a sixth P terminal (652 of FIG. 2).

In this configuration, the fifth module 500 and the sixth module 600 may be disposed so as to face each other. Therefore, the fifth P terminal 552 of the fifth module 500 and the sixth N terminal 651 of the sixth module 600 may be disposed so as to face each other. In addition, the fifth P terminal 552 and the sixth N terminal 651 may be electrically connected to each other without an additional circuit pattern. In this case, the fifth P terminal 552 and the sixth N terminal 651 may directly contact the outside of the fifth module 500 and the sixth module 600, or may be electrically connected to each other by being connected by the electrical conductive material. As described above, the fifth P terminal 552 and the sixth N terminal 651 may be electrically connected to each other so as to form the third output terminal 830. Here, the third output terminal 830 may output the U phase.

Each of the first module 100 to the sixth module 600 formed as described above may be separately packaged.

The heat radiation plate 710 may be formed at a lower portion of the first module 100 and the second module 200. The heat radiation plate 710 may be formed so as to radiate heat generated from the first module 100 to the sixth module 600 to the outside. The heat radiation plate 710 may be formed of the heat conductive material. For example, the heat radiation plate 710 may be a heat sink. Here, the heat radiation plate 710 and the first module 100 to the sixth module 600 may be each connected to each other by a screw. Alternatively, the heat radiation plate 710 and the first module 100 to the sixth module 600 may be adhered to each other by applying the adhesive material of the heat conductive material. Alternatively, the heat radiation plate 710 and the first module 100 to the sixth module 600 may be adhered to each other using a low temperature firing material such as a solder, a silver (Ag) paste, a copper (Cu) paste, or the like.

The housing 720 may be formed so as to protect the first module 100 to the sixth module 600 from the external environment. The housing 720 is formed on the heat radiation plate 710 so as to surround the first module 100 to the sixth module 600. The housing 720 formed as described above may be coupled to the heat radiation plate 710. For example, the housing 720 and the heat radiation plate 710 may be connected to each other by the screw. Alternatively, the housing 720 and the heat radiation plate 710 may be adhered to each other by applying the adhesive material of the heat conductive material. Although FIG. 3 shows a case in which the housing 720 is formed on the heat radiation plate 710, the present invention is not limited thereto. That is, the housing 720 may be formed so as to surround all configuration parts including the heat radiation plate 710. According to the prior art, the housing 720 is filled with a molding material such as an epoxy molding compound, a silicone gel, or the like, but the present invention does not necessarily require this configuration part. The reason is that the first module 100 to the sixth module 600 are separately molded. Therefore, whether or not the housing 720 is filled with the molding material may be performed by a selection of those skilled in the art.

That is, the housing terminal 730 may be formed so as to have the other end thereof protruded to the outside while penetrating through the housing 720. In addition, the housing terminal 730 may have one end thereof capable of being connected to any of all input and output terminals of the first module 100 to the sixth module 600. For example, the housing terminal 730 may be connected to the first N terminal 151, the second P terminal 252, the third N terminal 351, the fourth P terminal 452, the fifth N terminal 551, the sixth P terminal 652, the first output terminal 810, the second output terminal 820, and the third output terminal 830, respectively. In addition, the housing terminal 730 may be connected to other terminals of the first module 100 to the sixth module 600. The housing terminal 730 formed as described above may be formed so as to electrically connect the first module 100 to the sixth module 600 to the outside of the housing 720.

Although the preferred embodiment of the present invention shows a case in which the housing terminal 730 is formed so as to electrically connect the first module 100 to the sixth module 600 to the outside of the housing 720, the present invention is not limited thereto. That is, in the case in which the input and output terminals of the first module 100 to the sixth module 600 are formed so as to be long enough to be protruded to the outside of the housing 720, the housing terminal 730 may be omitted.

According to the preferred embodiment of the present invention, the semiconductor module package requiring only three input and output terminals may be implemented by disposing the same module rotated by 180°, as compared to the prior art in which four input and output terminals are required. Therefore, the circuit pattern for forming the input and output terminals may be decreased. Therefore, the size of the semiconductor module package may be decreased, the processes may be simplified, and the processing cost may be saved. In addition, the semiconductor module package according to the preferred embodiment of the present invention separately molds the respective modules, such that when the defect is generated, only the module having the defect is exchanged, thereby making it possible to save cost.

The semiconductor module package according to the preferred embodiment of the present invention may decrease processing time and cost.

The semiconductor module package according to the preferred embodiment of the present invention may decrease the size thereof.

The semiconductor module package according to the preferred embodiment of the present invention may decrease the cost caused by the defect occurrence.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A semiconductor module package, comprising:
    a first module including a first heat radiation substrate and one or more first semiconductor elements and having a first N terminal and a first P terminal formed at one end thereof;
    a second module including a second heat radiation substrate and one or more second semiconductor elements, having a second N terminal and a second P terminal formed at one end thereof, and disposed so as to face the first module;
    a third module including a third heat radiation substrate and one or more third semiconductor elements and having a third N terminal and a third P terminal formed at one end thereof;
    a fourth module including a fourth heat radiation substrate and one or more fourth semiconductor elements, having a fourth N terminal and a fourth P terminal formed at one end thereof, and disposed so as to face the third module;
    a fifth module including a fifth heat radiation substrate and one or more fifth semiconductor elements and having a fifth N terminal and a fifth P terminal formed at one end thereof;
    a sixth module including a sixth heat radiation substrate and one or more sixth semiconductor elements, having a sixth N terminal and a sixth P terminal formed at one end thereof, and disposed so as to face the fifth module;
    a first output terminal formed by electrically connecting the first module to the second module;
    a second output terminal formed by electrically connecting the third module to the fourth module; and
    a third output terminal formed by electrically connecting the fifth module to the sixth module.

2. The semiconductor module package as set forth in claim 1, wherein the first output terminal is formed by electrically connecting the first P terminal to the second N terminal, the second output terminal is formed by electrically connecting the third P terminal to the fourth N terminal, and the third output terminal is formed by electrically connecting the fifth P terminal to the sixth N terminal.

3. The semiconductor module package as set forth in claim 1, wherein the first output terminal outputs a W phase of W, V, and U phases, the second output terminal outputs a V phase of W, V, and U phases, and the third output terminal outputs a U phase of W, V, and U phases.

4. The semiconductor module package as set forth in claim 1, further comprising a heat radiation plate formed at a lower portion of the first module to the sixth module.

5. The semiconductor module package as set forth in claim 1, further comprising a housing formed so as to surround the first module to the sixth module.

6. The semiconductor module package as set forth in claim 5, wherein the first N terminal, the second P terminal, the third N terminal, the fourth P terminal, the fifth N terminal, the sixth P terminal, the first output terminal, the second output terminal, and the third output terminal are formed so as to be protruded to the outside while penetrating through the housing.

7. The semiconductor module package as set forth in claim 6, further comprising a housing terminal having one end contacting at least one of the first N terminal, the second P terminal, the third N terminal, the fourth P terminal, the fifth N terminal, the sixth P terminal, the first output terminal, the second output terminal, and the third output terminal, and the other end formed so as to be protruded to the outside while penetrating through the housing.

* * * * *